(12) United States Patent
Li et al.

(10) Patent No.: US 6,423,628 B1
(45) Date of Patent: Jul. 23, 2002

(54) METHOD OF FORMING INTEGRATED CIRCUIT STRUCTURE HAVING LOW DIELECTRIC CONSTANT MATERIAL AND HAVING SILICON OXYNITRIDE CAPS OVER CLOSELY SPACED APART METAL LINES

(75) Inventors: Weidan Li, San Jose; Wilbur G. Catabay, Saratoga; Wei-Jen Hsia, Sunnyvale, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/425,552

(22) Filed: Oct. 22, 1999

(51) Int. Cl.$^7$ .......................................... H01L 21/4763
(52) U.S. Cl. ..................... 438/622; 438/623; 438/627; 438/629
(58) Field of Search ..................... 438/618, 622–648

(56) References Cited

U.S. PATENT DOCUMENTS

| 3,012,861 A | 12/1961 | Ling | 23/223.5 |
| 3,178,392 A | 4/1965 | Kriner | 260/46.5 |
| 3,652,331 A | 3/1972 | Yamazaki | 117/201 |
| 3,832,202 A | 8/1974 | Ritchie | 106/287 |
| 3,920,865 A | 11/1975 | Läufer et al. | 427/220 |

(List continued on next page.)

FOREIGN PATENT DOCUMENTS

| DE | 198 04 375 A1 | 7/1999 | H01L/21/312 |
| EP | 0 706 216 A2 | 4/1996 | H01L/23/532 |
| EP | 0 949 663 A2 | 10/1999 | H01L/21/312 |
| JP | 63003437 | 1/1988 | H01L/21/90 |
| JP | 2000-267128 | 9/2000 | G02F/1/136 |
| WO | WO99/41423 | 8/1999 | |

OTHER PUBLICATIONS

Bothra, S., et al., "Integration of 0.25 $\mu$m Three and Five Level Inter–connect System for High Performance ASIC", *1997 Proceedings Fourteenth International VMIC Conference*, Santa Clara, CA, Jun. 10–12, 1997, pp. 43–48.

(List continued on next page.)

Primary Examiner—Jey Tsai
(74) Attorney, Agent, or Firm—John P. Taylor (57) ABSTRACT

A capping layer of an insulator such as silicon oxynitride is formed over horizontally closely spaced apart metal lines on an oxide layer of an integrated circuit structure formed on a semiconductor substrate. Low k silicon oxide dielectric material which exhibits void-free deposition properties in high aspect ratio regions between the closely spaced apart metal lines is then deposited over and between the metal lines and over the silicon oxynitride caps on the metal lines. After the formation of such void-free low k silicon oxide dielectric material between the closely spaced apart metal lines and the silicon oxynitride caps thereon, the structure is planarized to bring the level of the low k silicon oxide dielectric material down to the level of the tops of the silicon oxynitride caps on the metal lines. A further layer of standard k silicon oxide dielectric material is then formed over the planarized void-free low k silicon oxide dielectric layer and the silicon oxynitride caps. Vias are then formed through the standard k silicon oxide dielectric layer and the silicon oxynitride caps down to the metal lines. Since the vias are not formed through the low k silicon oxide dielectric material, formation of the vias does not contribute to poisoning of the vias. However, the presence of the low k silicon oxide dielectric material between the horizontally closely spaced apart metal lines reduces the horizontal capacitance between such metal lines.

11 Claims, 5 Drawing Sheets

U.S. PATENT DOCUMENTS

| | | | |
|---|---|---|---|
| 4,705,725 A | 11/1987 | Glajch et al. | 428/405 |
| 4,771,328 A | 9/1988 | Malaviya et al. | 357/49 |
| 5,194,333 A | 3/1993 | Ohnaka et al. | 428/405 |
| 5,314,845 A | 5/1994 | Lee et al. | 437/238 |
| 5,364,800 A | 11/1994 | Joyner | 437/28 |
| 5,376,595 A | 12/1994 | Zupancic et al. | 501/12 |
| 5,470,801 A | 11/1995 | Kapoor et al. | 437/238 |
| 5,558,718 A | 9/1996 | Leung | 118/723 E |
| 5,559,367 A | 9/1996 | Cohen et al. | 257/77 |
| 5,580,429 A | 12/1996 | Chan et al. | 204/192.38 |
| 5,628,871 A | 5/1997 | Shinagawa | 438/514 |
| 5,675,187 A | 10/1997 | Numata et al. | 257/758 |
| 5,688,724 A | 11/1997 | Yoon et al. | 437/235 |
| 5,858,879 A | 1/1999 | Chao et al. | 438/725 |
| 5,864,172 A | 1/1999 | Kapoor et al. | 257/634 |
| 5,874,367 A | 2/1999 | Dobson | 438/787 |
| 5,874,745 A | 2/1999 | Kuo | 257/59 |
| 5,882,489 A | 3/1999 | Bersin et al. | 204/192.35 |
| 5,904,154 A | 5/1999 | Chien et al. | 134/1.2 |
| 5,915,203 A | 6/1999 | Sengupta et al. | 438/669 |
| 5,939,763 A | 8/1999 | Hao et al. | 257/411 |
| 6,025,263 A | 2/2000 | Tsai et al. | 438/624 |
| 6,028,015 A | 2/2000 | Wang et al. | 438/789 |
| 6,037,248 A | 3/2000 | Ahn | 438/619 |
| 6,051,073 A | 4/2000 | Chu et al. | 118/723 |
| 6,051,477 A | 4/2000 | Nam | 438/404 |
| 6,066,574 A | 5/2000 | You et al. | 438/781 |
| 6,114,259 A | 9/2000 | Sukharev et al. | 438/789 |
| 6,143,638 A * | 11/2000 | Bohr | |
| 6,147,012 A | 11/2000 | Sukharev et al. | 438/787 |
| 6,153,524 A | 11/2000 | Henley et al. | 438/691 |
| 6,204,192 B1 | 3/2001 | Zhao et al. | 438/723 |
| 6,232,658 B1 | 5/2001 | Catabay et al. | 257/701 |

OTHER PUBLICATIONS

Dobson, C.D., et al., "Advanced SiO$_2$ Planarization Using Silane and H$_2$O$_2$", *Semiconductor International*, Dec. 1994, pp. 85–88.

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Peters, Laura, "Pursuing the Perfect Low–k Dielectric", *Semiconductor International*, vol. 21, No. 10, Sep. 1998, pp. 64–66, 68, 70, 72, and 74.

Koda, Seiichiro, et al., "A Study of Inhibition Effects for Silane Combustion by Additive Gases", *Combustion and Flame*, vol. 73, No. 2, Aug., 1988, pp. 187–194.

* cited by examiner

METHOD OF FORMING INTEGRATED CIRCUIT STRUCTURE HAVING LOW DIELECTRIC CONSTANT MATERIAL AND HAVING SILICON OXYNITRIDE CAPS OVER CLOSELY SPACED APART METAL LINES

BACKGROUND OF THE INVENTION

1. Field of the Invention

This invention relates to integrated circuit structures with reduced capacitance. More particularly, this invention relates to the formation of an integrated circuit structure with low dielectric constant dielectric material formed between horizontally closely spaced apart metal lines of an integrated circuit structure to reduce horizontal capacitance between closely spaced apart metal lines, while via poisoning in vias formed through dielectric material down to the metal lines is mitigated due to the presence of silicon oxynitride caps on the metal lines.

2. Description of the Related Art

In the continuing reduction of scale in integrated circuit structures, both the width of metal interconnects or lines and the horizontal spacing between such metal lines on any particular level of such interconnects have become smaller and smaller. As a result, horizontal capacitance has increased between such conductive elements. This increase in capacitance, together with the vertical capacitance which exists between metal lines on different layers, results in loss of speed and increased cross-talk. As a result, reduction of such capacitance, particularly horizontal capacitance, has received much attention. One proposed approach to solving this problem of high capacitance is to replace the conventional silicon oxide ($SiO_2$) dielectric material, having a dielectric constant (k) of about 4.0, with another dielectric material having a lower dielectric constant to thereby lower the capacitance.

In an article by L. Peters, entitled "Pursuing the Perfect Low-K Dielectric", published in Semiconductor International, Volume 21, No. 10, September 1998, at pages 64–74, a number of such alternate dielectric materials are disclosed and discussed. Included in these dielectric materials is a description of a low k dielectric material having a dielectric constant of about 3.0 formed using a chemical vapor deposition (CVD) process developed by Trikon Technologies of Newport, Gwent, U.K. The Trikon process is said to react methyl silane ($CH_3$—$SiH_3$) with hydrogen peroxide ($H_2O_2$) to form monosilicic acid which condenses on a cool wafer and is converted into an amorphous methyl-doped silicon oxide which is annealed at 400° C. to remove moisture. The article goes on to state that beyond methyl silane, studies show a possible k of 2.75 using dimethyl silane in the Trikon process.

The use of this type of low k material has been found to result in the formation of void-free filling of the high aspect ratio space between parallel closely spaced apart metal lines with dielectric material having a lower dielectric constant than that of convention silicon oxide, thereby resulting in a substantial lowering of the horizontal capacitance between such adjacent metal lines on the same metal wiring level.

However, the substitution of such low k dielectric materials for conventional silicon oxide insulation has not been without its own problem. It has been found that the subsequent formation of vias, or contact openings, through such low k dielectric material to the underlying conductive portions (such as metal lines, or contacts on an active device), can contribute to a phenomena known as via poisoning wherein filler material subsequently deposited in the via, such as a titanium nitride liner and tungsten filler material, fails to adhere to the via surfaces, resulting in unfilled vias. Apparently the presence of carbon in the low k dielectric material formed by the Trikon process renders the material more susceptible to damage during subsequent processing of the structure. For example, contact openings or vias are usually etched in the dielectric layer through a resist mask. When the resist mask is subsequently removed by an ashing process, damage can occur to the newly formed via surfaces of the low k material resulting in such via poisoning.

Copending U.S. patent application Ser. No. 09/426,061 entitled "LOW DIELECTRIC CONSTANT SILICON OXIDE-BASED DIELECTRIC LAYER FOR INTEGRATED CIRCUIT STRUCTURES HAVING IMPROVED COMPATIBILITY WITH VIA FILLER MATERIALS, AND METHOD OF MAKING SAME", was filed by one of us with others on Oct. 22, 1999, and is assigned to the same assignee as this application. The subject matter of Ser. No. 09/426,061 is hereby incorporated by reference. In one embodiment in that application, low k silicon oxide dielectric material having a high carbon doping level is formed in the high aspect ratio regions between closely spaced apart metal lines and then a second layer comprising a low k silicon oxide dielectric material having a lower carbon content is then deposited over the first layer and the metal lines.

Copending U.S. patent application Ser. No. 09/426,056 entitled "LOW K DIELECTRIC COMPOSITE LAYER FOR INTEGRATED CIRCUIT STRUCTURE WHICH PROVIDES VOID-FREE LOW K DIELECTRIC MATERIAL BETWEEN METAL LINES WHILE MITIGATING VIA POISONING", was filed by one of us with others on Oct. 22, 1999, and is assigned to the same assignee as this application. The subject matter of Ser. No. 09/426,056 is also hereby incorporated by reference. In one embodiment in that application, a void-free low k silicon oxide dielectric material is formed in the high aspect regions between closely spaced apart metal lines by one of several processes, including the process used to form the first low k silicon oxide dielectric material described in the previously cited Ser. No. 09/426,061 patent application. A second layer of low k silicon oxide dielectric material is then deposited over the first layer and the metal lines by a process which deposits at a rate higher than the deposition rate of the void-free dielectric material. In a preferred embodiment, both of the layers are formed in the same vacuum chamber without an intervening planarization step.

Thus, it is highly desirable to provide a structure having a low k dielectric layer, and a process for making same, wherein a dielectric layer is formed comprising low k silicon oxide dielectric material with void-free filling characteristics for high aspect ratio regions between closely spaced apart metal lines while mitigating the poisoning of vias subsequently formed in the dielectric layer down to the metal lines.

SUMMARY OF THE INVENTION

In accordance with the invention, a capping layer of silicon oxynitride is formed over horizontally closely spaced apart metal lines on an oxide layer of an integrated circuit structure formed on a semiconductor substrate. Low k silicon oxide dielectric material which exhibits void-free deposition properties in high aspect ratio regions between the closely spaced apart metal lines is then deposited over and between the metal lines and over the silicon oxynitride caps on the metal lines. After the formation of such void-free low k silicon oxide dielectric material between the closely spaced apart metal lines and the over silicon oxynitride caps thereon, the structure is planarized to bring the level of the low k material down to the level of the tops of the silicon oxynitride caps on the metal lines. A further layer of standard k dielectric material is then formed over the planarized void-free low k dielectric layer and the silicon oxynitride caps. Vias are then formed through the further dielectric layer and the silicon oxynitride caps down to the metal lines. Since the vias are not formed through the low k dielectric material, formation of the vias does not contribute to poisoning of the vias. However, the presence of the low k silicon oxide dielectric material between the horizontally closely spaced apart metal lines reduces the horizontal capacitance between such metal lines.

DETAILED DESCRIPTION OF THE INVENTION

The invention provides a structure and process wherein horizontal capacitance developed between closely spaced apart metal lines of an integrated circuit structure can be reduced without contributing to poisoning of vias subsequently formed down to such metal lines through dielectric material formed over the metal lines. In accordance with the invention, a capping layer of insulation material such as silicon oxynitride is formed over horizontally closely spaced apart metal lines on an oxide layer of an integrated circuit structure formed on a semiconductor substrate. Low k silicon oxide dielectric material which exhibits void-free deposition properties in high aspect ratio regions between the closely spaced apart metal lines is then deposited over and between the metal lines and over the silicon oxynitride caps on the metal lines. After the formation of such void-free silicon oxide dielectric material between the closely spaced apart metal lines and the silicon oxynitride caps thereon, the structure is planarized to bring the level of the low k material down to the level of the tops of the silicon oxynitride caps on the metal lines. A further layer of standard dielectric material is then formed over the planarized void-free low k silicon oxide dielectric layer and the silicon oxynitride caps. Vias are then formed through the further dielectric layer and the silicon oxynitride caps down to the metal lines. Since the vias are not formed through the low k dielectric material, formation of the vias does not contribute to poisoning of the vias. However, the presence of the low k silicon oxide dielectric material between the horizontally closely spaced apart metal lines reduces the horizontal capacitance between such metal lines.

The term "low k", as used herein is intended to define a dielectric constant of 3.5 or less, preferably 3.0 or less, while the term "standard k", as used herein is intended to define a dielectric constant of over 3.5, typically about 4.0.

The term "high aspect ratio", as used herein to define the space between closely spaced apart metal lines, is intended to define a height to width ratio of at least 2, and usually about 3. The term "closely spaced apart metal lines", as used herein is therefore intended to define metal lines on the same level having a horizontal space between them which has a "high aspect ratio", as that term is defined above.

Figure 1:
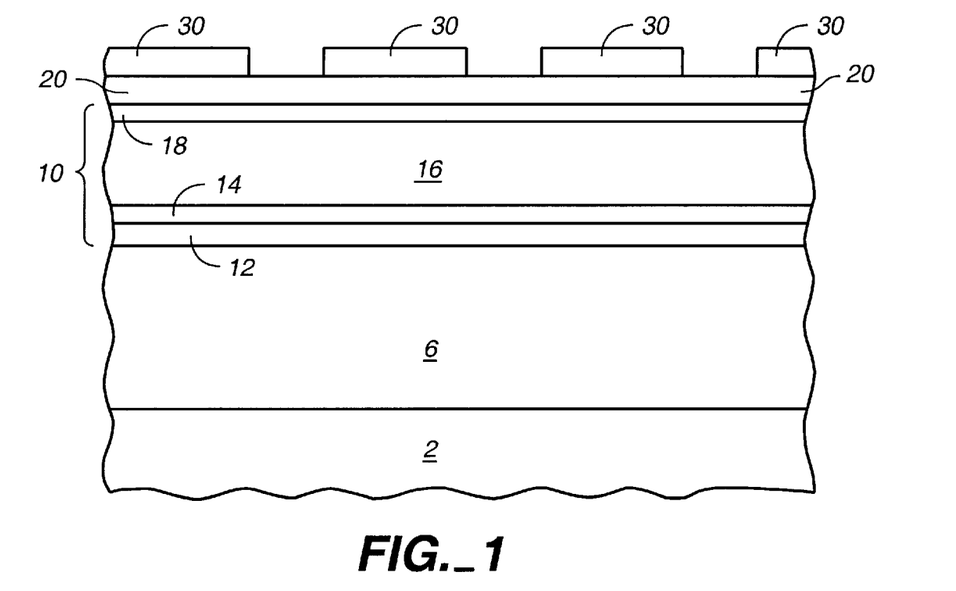
FIG. 1 is a fragmentary vertical cross-sectional view of an integrated circuit structure with a composite layer formed on an oxide layer and a silicon oxynitride layer formed over the composite layer, with a resist mask formed over the silicon oxynitride layer.

Turning now to FIG. 1, an integrated circuit structure 2 is shown with an oxide layer 6 such as a layer of silicon oxide conventionally formed over integrated circuit structure 2. Integrated circuit 2 includes semiconductor devices such as transistors formed in a semiconductor substrate, with contact openings (not shown) formed through oxide layer 6 from contacts on such devices. Structure 2 may further comprises lower layers of metal lines or interconnects formed therein with vias (not shown) formed through oxide layer 6 from such lower metal lines.

Formed over oxide layer 6 is a conventional electrically conductive composite layer 10 which typically may comprise a first layer 12 of a metal such as titanium to provide a conductive metal contact to underlying electrically conductive materials of the integrated circuit structure (such as metal-filled vias or contact openings), and a second layer 14 of a material such as titanium nitride which serves as a protective or barrier layer of electrically conductive material to isolate main electrically conductive metal layer 16 from interaction with underlying materials such as silicon or the titanium layer.

Typically main electrically conductive metal layer 16 will comprise a metal or metals such as aluminum or an aluminum/copper alloy. Top layer 18, also typically formed of titanium nitride in the illustrated embodiment, serves the same purpose as titanium nitride layer 14, i.e., to provide an electrically conductive layer which will metallurgically isolate main aluminum layer 16 from other materials in the integrated circuit structure, It should be noted that while composite layer 10 is illustrated and described as a typical four layer composite layer, as is well known to those skilled in the art, other combinations of layers of metals and electrically conductive metal compounds could be used for the formation of electrically conductive composite layer 10 in accordance with the invention, and the use of the term "composite layer" should not, therefore, be construed as limited to the four illustrated electrically conductive layers.

In accordance with the invention, a silicon oxynitride layer 20 is formed over composite layer 10. Layer 20 serves multifunctional purposes in the formation of the metal lines and dielectric layer over and between the lines as will be described. First of all, silicon oxynitride layer 20 acts as an antireflective coating (ARC) layer for subsequent lithography used to form the metal lines. This is a very useful function for layer 20 since it permits the thinning of underlying titanium nitride layer 18 which previously served the dual function of metallurgically isolating main aluminum layer 16 from other materials and as an ARC layer.

Silicon oxynitride layer 20 preferably ranges in thickness either from about 20 nm to about 40 nm or from about 80 nm to about 100 nm. These ranges have been determined to be optimum for the desired optical properties of the silicon oxynitride layer. and also provide an adequate thickness for the CMP stop layer.

Silicon oxynitride layer 20 may be formed over titanium nitride upper barrier layer 18 by PECVD using $SiH_4$, $N_2O$, and $NH_3$ as the sources of silicon, oxygen, and nitrogen. The deposition is carried out at an elevated temperature of about 400° C., and at a pressure of about 2–3 Torr.

Figure 2:
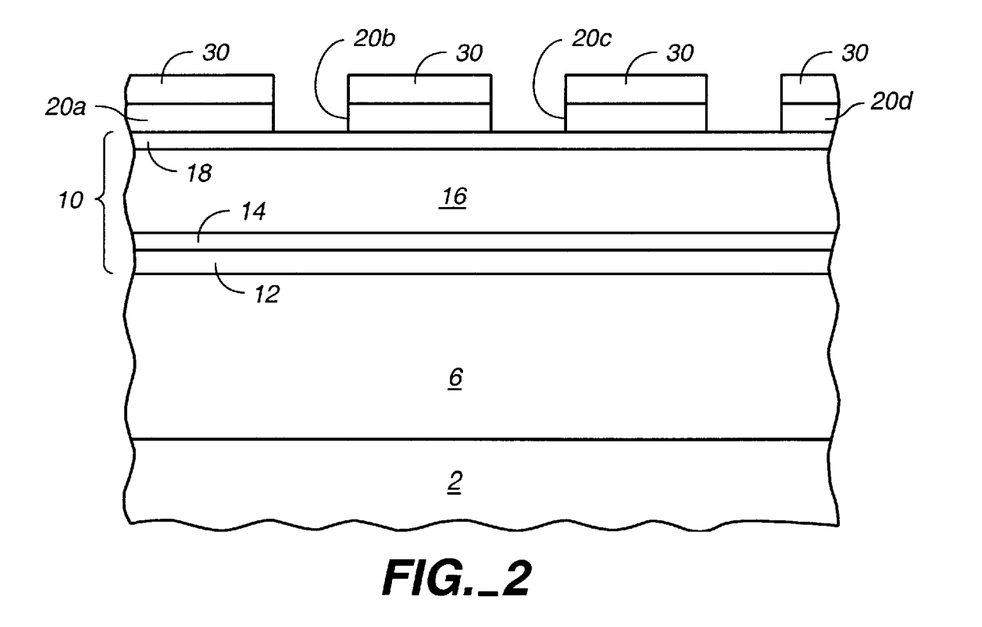
FIG. 2 is a fragmentary vertical cross-sectional view of the structure of FIG. 1 showing the silicon oxynitride layer etched through the resist mask.

As seen in FIG. 1, over silicon oxynitride layer 20 is formed a resist mask 30 which is patterned to form a series of metal lines or interconnects from underlying composite layer 10. As shown in FIG. 2, silicon oxynitride layer 20 is first etched through the openings in resist mask 30 to reproduce the pattern of openings in silicon oxynitride layer 20. A plasma etcher using a $CHF_3$ and $O_2$ etch system may be used for this selective etching of silicon oxynitride layer 20. FIG. 2 shows the result of this etching step wherein the pattern in resist mask 30 has now been reproduced in silicon oxynitride layer 20, as shown at 20a–20d in FIG. 2. This, in turn, permits remaining silicon oxynitride portions 20a–20d to act as an etch mask for composite layer 10 which constitutes the second advantage for the use of silicon oxynitride layer 20 in the structure of the invention. The use of silicon oxynitride layer 20 as an etch mask means that resist mask 30 can be initially constructed thinner (e.g., about 4000 Å instead of about 6000 Å) than if only resist mask 30 were to be used for the etching of composite layer 10. The formation of a thinner resist mask 30, in turn, results in more accurate formation of resist mask 30.

Figure 3:
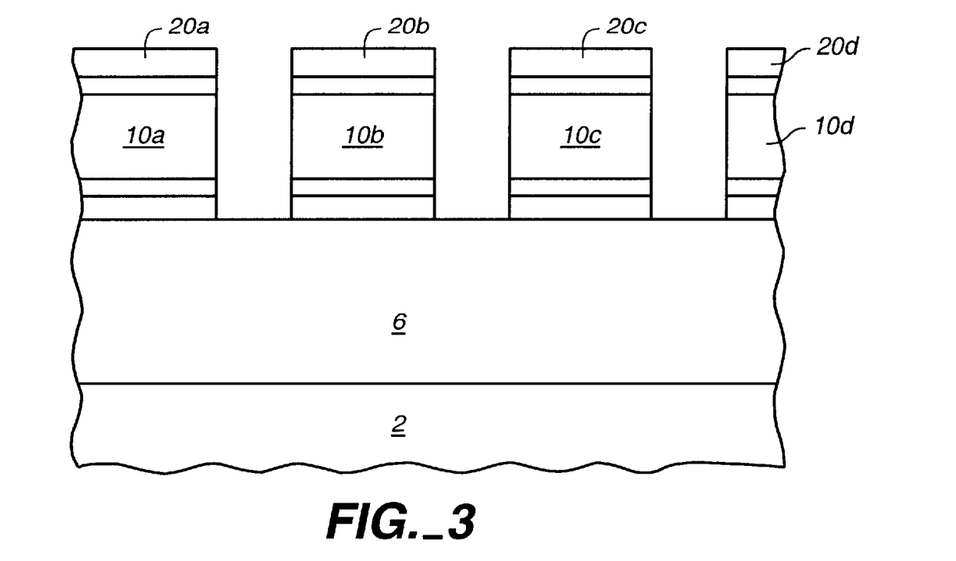
FIG. 3 is a fragmentary vertical cross-sectional view of the structure of FIG. 2 with the composite layer etched through the resist mask and the silicon oxynitride mask to form metal lines over the oxide layer.

After the etching of silicon oxynitride layer 20, the underlying layers comprising composite layer 10 may be etched through resist mask 30 and the openings between remaining portions 20a–20d of layer 20 (i.e., through the etch mask formed by the previous etching of layer 20). This etching of the four illustrated layers comprising composite layer 10 forms electrically conductive composite lines which will herein after be referred to and illustrated as metal lines 10a–10d. Metal lines 10a–10d are capped by silicon oxynitride portions or caps 20a–20d, as shown in FIG. 3. It should be noted that the term "metal lines", as used herein, includes the presence of layers of electrically conductive metal compounds such as titanium nitride. Therefore, it will be understood that the term "metal lines", as used herein, is not limited to only metals, but includes electrically conductive metal compounds as well.

This etching of layers 12, 14, 16, and 18 comprising composite layer 10 may be carried out by first etching titanium nitride layer 18, using $Cl_2$ and $BCl_3$ etch chemistry, then etching aluminum layer 16 using the same etch chemistry, and then etching titanium nitride layer 14 with the same etchant chemistry, and then finally etching titanium layer 12 again using $Cl_2$ and $BCl_3$ etch chemistry, with the etch stopping at oxide layer 6. Such a conventional etchant system which is selective to the resist mask is also selective to the silicon oxynitride mask as well. That is, for the etchant system just described, the respective materials (titanium nitride, aluminum, and titanium metal) will each etch at a much faster rate than will the silicon oxynitride etch mask.

Resist layer 30 is then removed by a conventional ashing system, leaving on oxide layer 6 a system of metal lines, each capped with silicon oxynitride, as exemplified by the metal lines 10a–10d capped by silicon oxynitride caps 20a–20d shown in FIG. 3.

After formation of metal lines 10a–10d capped with silicon oxynitride caps 20a–20d, a protective or barrier layer 38 of conventional (standard k) dielectric material is deposited over the entire structure to protect the subsequently deposited low k silicon oxide dielectric material to be described below from direct contact with the underlying metal lines. Barrier layer 38 may range in thickness from about 3 nm (the minimum amount for the desired protection) up to a maximum thickness of about 10 nm (beyond which the benefits of the low k dielectric material to be formed thereover will be negatively impacted).

Figure 4:
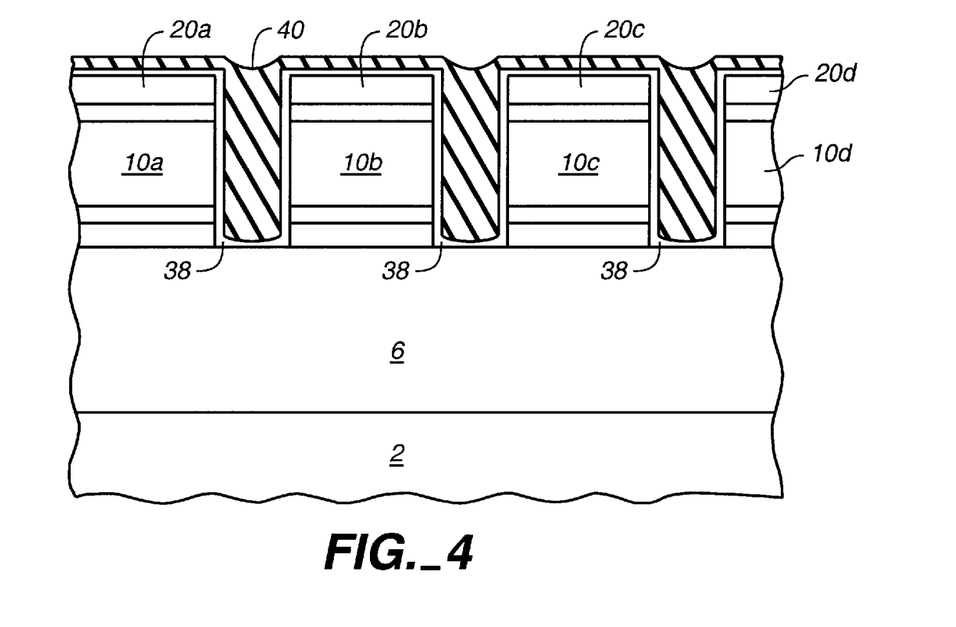
FIG. 4 is a fragmentary vertical cross-sectional view of the structure of FIG. 3 showing a low k silicon oxide dielectric material deposited over and between the metal lines after removal of the resist mask.

A layer 40 of low k silicon oxide dielectric material is then deposited over barrier layer 38 in the regions between metal lines 10a–10d down to oxide layer 6, and over the tops of silicon oxynitride caps 20a–20d, as shown in FIG. 4. Low k silicon oxide dielectric layer 40 comprises a silicon oxide dielectric material having a dielectric constant of 3.5 or less, preferably 3.0 or less, and capable of forming void-free dielectric material in the regions between closely spaced apart metal lines, i.e., in openings having a high aspect ratio of at least 2, usually at least 3.

Such void-free low k silicon oxide dielectric material may be deposited between metal lines 10a–10d and over caps 20a–20d by reacting hydrogen peroxide with a carbon-substituted silane such as methyl silane, as described in the aforementioned article by L. Peters, and described in general for silane and peroxide reactions in Dobson U.S. Pat. No. 5,874,367, the subject matter of which is hereby incorporated by reference. The void-free low k silicon oxide dielectric material may also be deposited by reacting a mild oxidant such as hydrogen peroxide with the carbon-substituted silane materials disclosed in Aronowitz et al. U.S. Pat. No. 6,303,047, assigned to the assignee of this application, the subject matter of which is also hereby incorporated by reference.

Void-free low k silicon oxide dielectric layer 40 is deposited in sufficient quantity to completely fill all of the space between metal lines 10a–10d. While it is not required that low k dielectric layer 40 cover silicon oxynitride caps 20a–20d, the deposition of a sufficient amount of low k dielectric layer 40 to cover caps 20a–20d insures that the spaces between metal lines 10a–10d, i.e., the regions where it is desirable to suppress horizontal capacitance, are completely filled with the low k silicon oxide dielectric material. Otherwise, such portions between metal lines 10a–10d not filled with low k dielectric material will be filled with conventional (standard k) dielectric material, as will be explained below, thus increasing the horizontal capacitance between the metal lines.

After deposition of layer 40 of low k silicon oxide dielectric material, the structure is subject to an anneal or heat-treatment prior to planarization, such as by chemical mechanical polishing (CMP). The structure may be removed from the deposition reactor and heat treated at a temperature of between about 300° C. to about 500° C., typically from about 400° C. to about 450° C. for about 2–5 minutes, i.e., subject to a rapid thermal anneal (RTA). Conventional annealing, i.e., baking at the same temperature for up to 60 minutes, may also be used, but is not preferred due to the adverse effect on the thermal budget of the structure.

Figure 5:
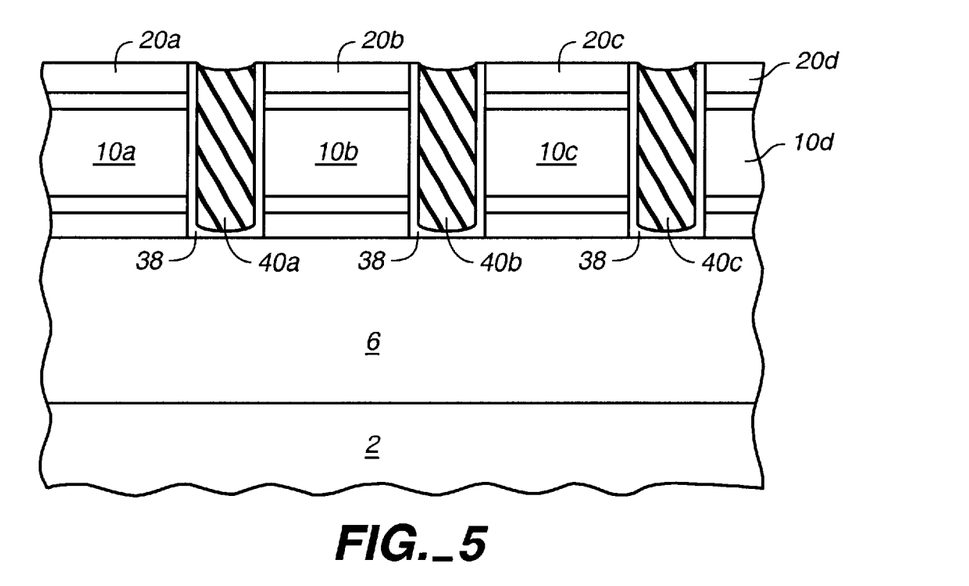
FIG. 5 is a fragmentary vertical cross-sectional view of the structure of FIG. 4 after planarization of the low k silicon oxide dielectric material down to the top of the silicon oxynitride caps on the metal lines.

The annealed structure is then moved to a planarization chamber or apparatus where all of the low k dielectric material on the upper surface of silicon oxynitride caps 20a–20d is removed, leaving only low k silicon oxide dielectric material 40a–40c in the respective regions between metal lines 10a–10d, as shown in FIG. 5. Such excess low k dielectric material can be removed by a chemical mechanical polishing (CMP) process, using a KOH-based oxide CMP slurry which is selective to silicon oxynitride, i.e., will etch the low k silicon oxide dielectric material of layer 40 in preference to silicon oxynitride. The low k silicon oxide dielectric material is then removed by the CMP process until the top surface of the silicon oxynitride caps 20a–20d is exposed which then functions as an etch stop. This constitutes yet a third function of silicon oxynitride caps 20a–20d.

Figure 6:
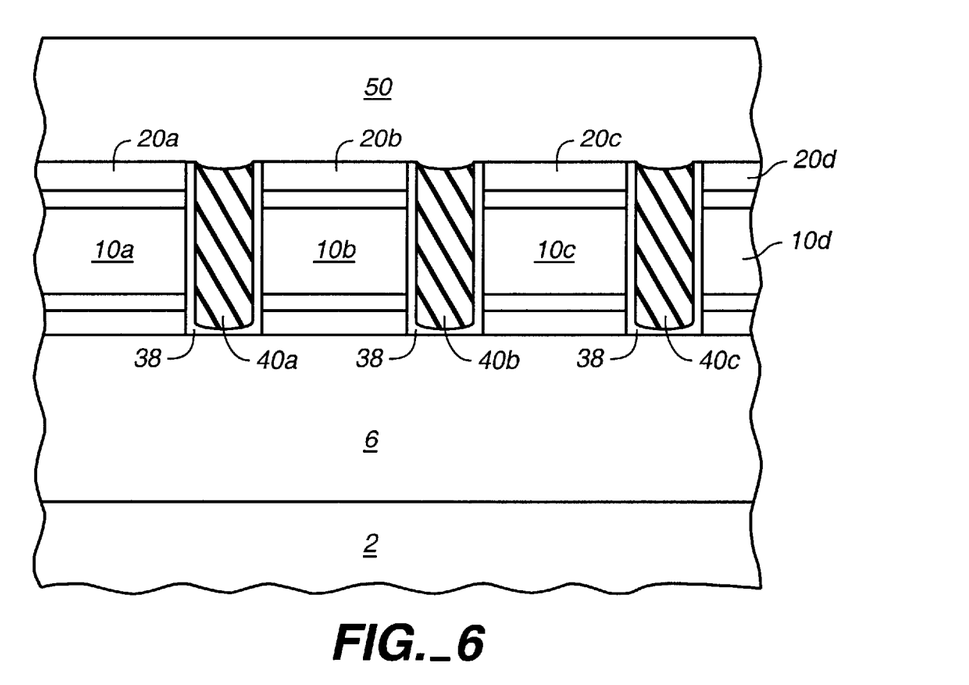
FIG. 6 is a fragmentary vertical cross-sectional view of the structure of FIG. 5 after deposition of further dielectric material over the planarized low k silicon oxide dielectric material and the silicon oxynitride caps.

After planarization of the structure by removal of the excess low k dielectric material, the structure is moved to a deposition apparatus where a further layer 50 of conventional (standard k) silicon oxide dielectric material is deposited over the planarized low k silicon oxide dielectric material of layer 40 and over the tops of silicon oxynitride caps 20a–20d, as shown in FIG. 6. In accordance with a preferred embodiment of the invention standard k silicon oxide dielectric material is deposited over planarized low k dielectric layer 40 by any conventional deposition process including, by way of example only, TEOS (tetraethyl orthosilicate) and $O_2/O_3$, fluorinated silicon glass (FSG) using high density plasma (HDP), and plasma enhanced chemical vapor deposition (PECVD) using silane and $O_2$. The thickness of layer 50 will depend upon the desired overall thickness of dielectric material separating metal lines 10a–10d from the next layer of integrated circuit material such as another layer of metal lines. Typically the thickness of standard k silicon oxide dielectric layer 50 deposited over the structure will range from about 300 nm to about 700 nm.

Figure 7:
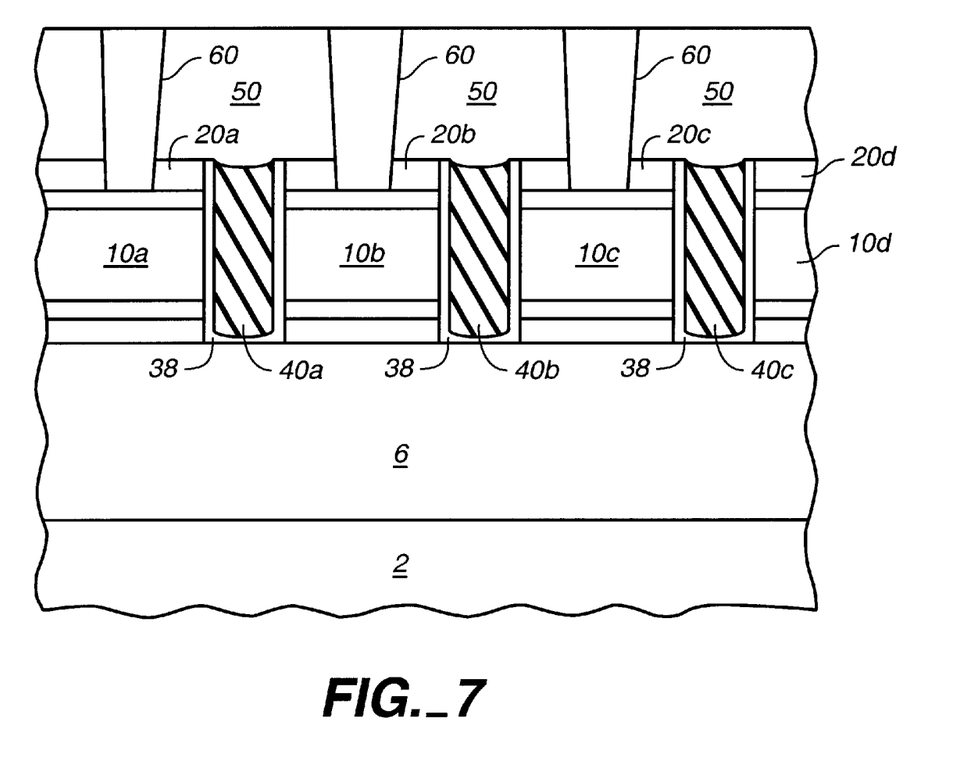
FIG. 7 is a fragmentary vertical cross-sectional view of the structure of FIG. 6 after formation of vias through the further dielectric material and the silicon oxynitride caps down to the metal lines.
Figure 8:
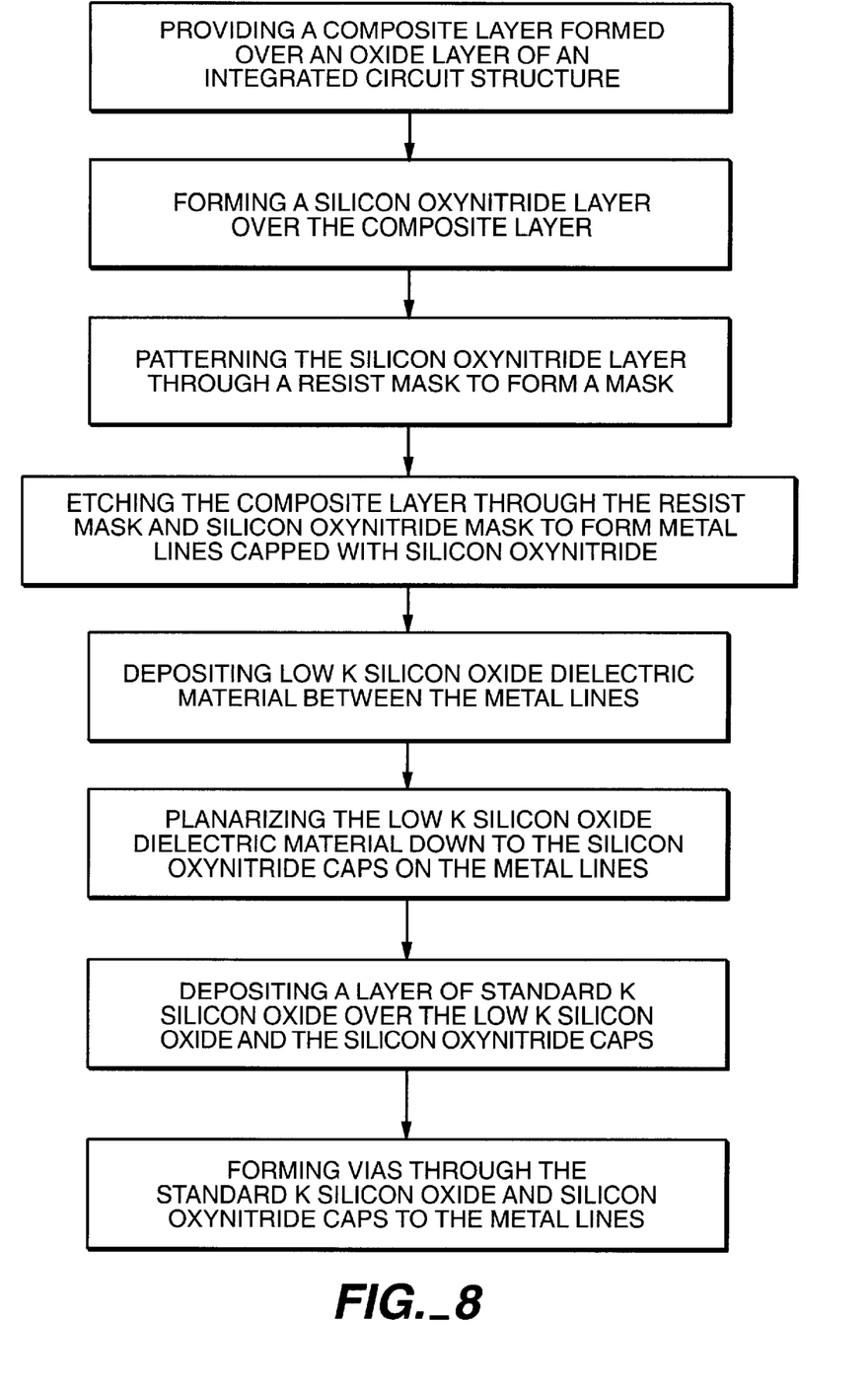
FIG. 8 is a flow sheet illustrating the process of the invention.

After formation of standard k silicon oxide layer 50, an optional further planarization step may be carried out if the process chosen for deposition of dielectric layer 50 doe not result in a planarized top surface on layer 50. A via resist mask (not shown) may then be formed over silicon oxide dielectric layer 50 and vias 60 may then be cut through dielectric layer 50 and underlying silicon oxynitride caps 20a–20d to the tops of metal lines 10a–10d, as shown in FIG. 7. Vias 60 are etched using, for example, a $CF_4$ and $CHF_3$ plasma etch system to etch oxide layer 50 down to the top surface of silicon oxynitride caps 20a–20d. The etchant is then changed to a $CHF_3$ and $O_2$ etchant system to etch through the exposed portions of silicon oxynitride caps 20a–20d down to metal lines 10a–10d. Vias 60 may then be filled with appropriate electrically conductive filler material, e.g, a titanium nitride liner and a tungsten filler material, as is well known to those skilled in the art.

The resultant structure, as shown in FIG. 7, is formed with low k silicon oxide dielectric material occupying the entire region between the metal lines so that horizontal capacitance between the closely spaced apart metal lines is suppressed or reduced. However, due to the presence of the silicon oxynitride cap material on the upper surfaces of the metal lines, functioning as a buffer material between sidewalls of the vias and the low k silicon oxide dielectric material, the low k silicon oxide dielectric material can be deposited in the regions between closely spaced apart metal lines up to the very top of the metal lines without surfaces of such low k silicon oxide dielectric material becoming subsequently exposed by formation of the vias down to the metal lines. Via poisoning due to exposure of portions of the low k silicon oxide dielectric material during via formation is thereby suppressed or eliminated, because the sidewalls of the vias only cut through the layer of standard k silicon oxide material and the silicon oxynitride buffer material, i.e., the vias do not pass through the low k silicon oxide dielectric material.

The following example will serve to further illustrate the invention.

EXAMPLE

A 90 nm silicon oxynitride layer may be deposited over an electrically conductive composite layer previously formed over an oxide layer on an eight inch diameter silicon substrate by plasma enhanced chemical vapor deposition (PECVD), using $SiH_4$, $N_2O$, and $NH_3$ gases. The underlying composite layer can consist of a titanium bottom layer, a lower titanium nitride barrier layer over the titanium layer, a main aluminum/copper alloy layer, and a top titanium nitride barrier layer. A resist mask, patterned to form a series of metal lines or interconnects, is then formed over the silicon oxynitride layer. The silicon oxynitride layer is then etched through the resist mask using a $CHF_3$ and $O_2$ etch system to expose the underlying titanium nitride top barrier layer, i.e., the uppermost layer of the electrically conductive composite layer.

The titanium nitride layer is then etched through to the aluminum/copper alloy layer, using a $Cl_2$ and $BCl_3$ etch system selective to silicon oxynitride to thereby permit the previously etched silicon oxynitride layer to function as a mask. The same etch system is then used to etch the aluminum/copper alloy layer, the lower titanium nitride barrier layer, and the titanium layer, with the etch stopping when the underlying oxide layer is reached. The result will be a pattern of silicon nitride-capped metal lines having a horizontal spacing there between of about 200 nm, and a height of about 500 nm, resulting in regions between the closely spaced apart metal lines having an aspect ratio of about 2.5.

After the etching of the composite layer is completed to form the pattern of silicon nitride-capped metal lines or interconnects, the resist mask can be removed with a conventional ashing process, i.e., using $O_2$ with a plasma. A thin barrier layer of silicon oxide can then be deposited over the structure by PECVD to a thickness of about 3 nm, again using $SiH_4$, $N_2O$, and $NH_3$ gases.

A layer of low k silicon oxide dielectric material can then be deposited in the regions between the closely spaced apart metal lines by flowing carbon-doped silane and hydrogen peroxide into the deposition chamber, while the chamber is maintained at a temperature of 0° C. until the deposition of low k silicon oxide dielectric material reaches the top of the silicon oxynitride caps on the metal lines. The structure is then heat treated for 3 minutes at a temperature of between about 400–450° C., following which the structure can be planarized by CMP. A 500 nm layer of standard k silicon oxide dielectric material is then deposited over the structure using PECVD.

After formation of the standard k silicon oxide dielectric layer over the low k silicon oxide dielectric layer and over the exposed silicon oxynitride caps over the metal lines, the substrate is removed from the reactor. A via resist mask is then applied to the upper surface of the PECVD oxide layer. Vias are cut through the PECVD standard k silicon oxide layer, using $CF_4$, and $O_2$, stopping at the silicon oxynitride cap on the metal line. The etchant system is then changed to a $CHF_3$ and $O_2$ etch system to etch silicon oxynitride selective to titanium nitride until the bottom of the vias reaches the titanium nitride top barrier layer of the metal lines.

The vias can then be filled by first sputtering a protective coating of titanium nitride over the surfaces of the vias and then filling the vias with tungsten. When the substrate is then examined in cross-section by scanning electron microscopy (SEM) to determine how many of the vias were filled with tungsten, it will be found that substantially all of the vias will filled with tungsten, indicating an absence of via poisoning.

Thus the invention provides a structure, and process for forming same wherein low k silicon oxide dielectric material occupies the entire region between closely spaced apart metal lines so that horizontal capacitance between the closely spaced apart metal lines is suppressed or reduced, while at the same time, via poisoning can also be suppressed or eliminated due to the presence of the silicon oxynitride cap material on the upper surfaces of the metal lines and the formation of standard k silicon oxide dielectric material above the silicon oxynitride caps.

This silicon oxynitride cap layer on the metal lines functions as a buffer material between the sidewalls of the vias and the low k silicon oxide dielectric material. Thus, the low k silicon oxide dielectric material can be deposited in the regions between closely spaced apart metal lines up to the very top of the metal lines without surfaces of such low k silicon oxide dielectric material becoming subsequently exposed by formation of the vias down to the metal lines. Since the vias do not pass through the low k silicon oxide dielectric material, via poisoning due to exposure of portions of the low k silicon oxide dielectric material during via formation is thereby suppressed or eliminated, because the sidewalls of the vias only cut through the layer of standard k silicon oxide dielectric material and the silicon oxynitride buffer material.

Having thus described the invention what is claimed is:

1. A process for forming an integrated circuit structure on a semiconductor substrate and characterized by reduced horizontal capacitance between closely spaced apart metal lines and elimination of via poisoning which comprises:
   a) forming a composite layer of electrically conductive material on an oxide layer of an integrated circuit structure on a semiconductor substrate;
   b) forming a silicon oxynitride layer over said composite layer;
   c) patterning said silicon oxynitride layer;
   d) patterning said composite layer through said patterned silicon oxynitride layer to form closely spaced apart metal lines capped with silicon oxynitride on said oxide layer;
   e) depositing between said closely spaced apart metal lines and over said silicon oxynitride caps on said metal lines low k silicon oxide dielectric material having a dielectric constant of 3.0 or less and formed by reacting carbon-substituted silane with hydrogen peroxide;
   f) planarizing said low k silicon oxide dielectric material down to the level of a top surface of said silicon oxynitride caps;
   g) depositing a layer of standard k silicon oxide over said planarized low k silicon oxide dielectric and said silicon oxynitride caps;
   h) forming vias through said layer of standard k silicon oxide and said silicon oxynitride caps down to said closely spaced apart metal lines;
   i) forming a protective coating of titanium nitride over the surfaces of said vias; and
   j) then filling said vias with tungsten;

whereby said formation of said vias through said layer of standard k silicon oxide and said silicon oxynitride caps down to said closely spaced apart metal lines eliminates said via poisoning whereby said vias can be filled with said tungsten.

2. The process of claim 1 wherein said step of forming a silicon oxynitride layer over said composite layer further comprises forming from about 300 Å to about 1200 Å of silicone oxynitride over said composite layer.

3. The process of claim 1 wherein said step of forming a silicone oxynitride layer over said composite layer further comprises forming silicone oxynitride by PECVD using $SiH_4$, $N_2O$, and $NH_3$ gases.

4. The process of claim 2 wherein said step of forming a composite layer of electrically conductive material on an oxide layer of an integrated circuit structure on a semiconductor substrate comprises the further steps of:
   a) forming a first barrier layer of electrically conductive material over said oxide layer;
   b) forming a main metal layer on said first barrier layer; and
   c) forming a second barrier layer of electrically conductive material on said main metal layer.

5. The process of claim 4 wherein said step of forming a main metal layer comprises forming a main metal layer from aluminum or an alloy of aluminum and copper containing same.

6. The process of claim 4 wherein said first and second barrier layers of electrically conductive material comprise titanium nitride.

7. The process of claim 2 wherein said step of forming a composite layer of electrically conductive material on an oxide layer of an integrated circuit structure on a semiconductor substrate comprises the further steps of:
   a) forming over said oxide layer a first layer of metal capable of providing a conductive metal contact to underlying electrically conductive materials of said integrated circuit structure;
   b) forming a first barrier layer of electrically conductive material over said first layer of metal;
   c) forming a main metal layer on said first barrier layer; and
   d) forming a second barrier layer of electrically conductive material on said main metal layer.

8. The process of claim 7 wherein said step of forming over said oxide layer a first layer of metal capable of providing a conductive metal contact to underlying electrically conductive materials of said integrated circuit structure further comprises forming a layer of titanium over said oxide layer.

9. The process of claim 1 wherein said carbon-substituted silane comprises a carbon-substituted silane having only primary hydrogens bonded to the carbon atoms and having the formula $SiH_x((C)_y(CH_3)_z)_{(4-x)}$, where x ranges from 1 to 3, y is an integer from 1 to 4 for a branched alkyl group and from 3 to 5 for a cyclic alkyl group, and z is 2y+1 for a branched alkyl group and 2y−1 for a cyclic alkyl group.

10. The process of claim 2 wherein said step of planarizing said low k silicon oxide dielectric material down to the level of a top surface of said silicon oxynitride caps further comprises chemically/mechanically polishing said low k silicon oxide dielectric material.

11. A process for forming an integrated circuit structure on a semiconductor substrate and characterized by reduced horizontal capacitance between closely spaced apart metal lines thereon without poisoning of vias formed through dielectric material to such metal lines which process comprises:

a) forming on an oxide layer of an integrated circuit structure on a semiconductor substrate a composite layer of electrically conductive material by the steps of:
   i) forming a first barrier layer of electrically conductive material over said oxide layer;
   ii) forming a main metal layer on said first barrier layer; and
   iii) forming a second barrier layer of electrically conductive material on said main metal layer;
b) forming over said composite layer a silicon oxynitride layer ranging in thickness from about 300 Å to about 1200 Å;
c) patterning said silicon oxynitride layer;
d) patterning said composite layer through said patterned silicon oxynitride layer to form closely spaced apart metal lines capped with silicon oxynitride on said oxide layer;
e) depositing between said closely spaced apart metal lines and over said silicon oxynitride caps on said metal lines low k silicon oxide dielectric material formed by reacting carbon-substituted silane with hydrogen peroxide;
f) planarizing said low k silicon oxide dielectric material down to the level of a top surface of said silicon oxynitride caps by chemically/mechanically polishing said low k silicon oxide dielectric material;
g) depositing a layer of standard k silicon oxide dielectric material over said planarized low k silicon oxide dielectric material and said silicon oxynitride caps; and
h) forming vias through said layer of standard k silicon oxide dielectric material and said silicon oxynitride caps down to said metal lines without contacting said low k silicon oxide dielectric material, whereby poisoning of said vias by said process is avoided.

* * * * *